(12) United States Patent
Wu et al.

(10) Patent No.: US 11,355,603 B2
(45) Date of Patent: Jun. 7, 2022

(54) METHODS AND STRUCTURES OF NOVEL CONTACT FEATURE

(71) Applicant: Taiwan Semiconductor Manufacturing Company, Ltd., Hsin-Chu (TW)

(72) Inventors: Wei-Hao Wu, Hsinchu (TW); Chia-Hao Chang, Hsinchu (TW); Chih-Hao Wang, Hsinchu County (TW); Jia-Chuan You, Taoyuan County (TW); Yi-Hsiung Lin, Hsinchu County (TW); Zhi-Chang Lin, Hsinchu County (TW); Chia-Hao Kuo, Taoyuan (TW); Ke-Jing Yu, Kaohiung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 105 days.

(21) Appl. No.: 16/719,346

(22) Filed: Dec. 18, 2019

(65) Prior Publication Data

US 2020/0127105 A1 Apr. 23, 2020

Related U.S. Application Data

(60) Continuation of application No. 15/670,052, filed on Aug. 7, 2017, now Pat. No. 10,522,633, which is a
(Continued)

(51) Int. Cl.
*H01L 29/417* (2006.01)
*H01L 29/78* (2006.01)
(Continued)

(52) U.S. Cl.
CPC .......... *H01L 29/41791* (2013.01); *H01L 21/823431* (2013.01); *H01L 21/823468* (2013.01); *H01L 21/823475* (2013.01); *H01L 21/823481* (2013.01); *H01L 23/535* (2013.01); *H01L 27/0886* (2013.01); *H01L 29/495* (2013.01);
(Continued)

(58) Field of Classification Search
CPC ..................................................... H01L 23/535
See application file for complete search history.

(56) References Cited

U.S. PATENT DOCUMENTS 8,487,378 B2   7/2013  Goto et al.
8,593,854 B1  11/2013  Chih et al.
(Continued)

*Primary Examiner* — William A Harriston
(74) *Attorney, Agent, or Firm* — Haynes and Boone, LLP

(57) ABSTRACT

A method of fabricating a semiconductor device is disclosed. The method includes forming a fin structure on a substrate; forming a dummy gate over the fin structure; forming spacers on sides of the dummy gate; forming a doped region within the fin structure; replacing the dummy gate with a metal gate; replacing an upper portion of the metal gate with a first dielectric layer; forming a conductive layer directly on the doped region; replacing an upper portion of the conductive layer with a second dielectric layer; removing the first dielectric layer thereby exposing a sidewall of the spacer; removing an upper portion of the spacer to thereby expose a sidewall of the second dielectric layer; removing at least a portion of the second dielectric layer to form a trench; and forming a conductive plug in the trench.

20 Claims, 12 Drawing Sheets

Related U.S. Application Data division of application No. 14/941,802, filed on Nov. 16, 2015, now Pat. No. 9,728,505.

(51) Int. Cl.

| | |
|---|---|
| *H01L 29/66* | (2006.01) |
| *H01L 21/8234* | (2006.01) |
| *H01L 23/535* | (2006.01) |
| *H01L 27/088* | (2006.01) |
| *H01L 29/49* | (2006.01) |

(52) U.S. Cl.
CPC .. *H01L 29/66545* (2013.01); *H01L 29/66795* (2013.01); *H01L 29/78* (2013.01); *H01L 29/785* (2013.01)

(56) References Cited

U.S. PATENT DOCUMENTS

| | | | |
|---|---|---|---|
| 8,605,523 | B2 | 12/2013 | Tao et al. |
| 8,630,132 | B2 | 1/2014 | Cheng et al. |
| 8,729,634 | B2 | 5/2014 | Shen et al. |
| 8,760,948 | B2 | 6/2014 | Tao et al. |
| 8,826,213 | B1 | 9/2014 | Ho et al. |
| 8,869,436 | B2 | 10/2014 | Tsai et al. |
| 8,887,106 | B2 | 11/2014 | Ho et al. |
| 2007/0018254 | A1* | 1/2007 | Yoo ............... H01L 29/665 257/382 |
| 2009/0108379 | A1* | 4/2009 | Oosuka ........... H01L 21/823468 257/412 |
| 2013/0234094 | A1 | 9/2013 | Chang et al. |
| 2013/0336041 | A1 | 12/2013 | Tsai et al. |
| 2014/0032871 | A1 | 1/2014 | Hsu et al. |
| 2014/0146593 | A1 | 5/2014 | Tsai et al. |
| 2014/0153321 | A1 | 6/2014 | Liaw |
| 2014/0153345 | A1 | 6/2014 | Kim et al. |
| 2014/0166961 | A1 | 6/2014 | Liao et al. |
| 2014/0175365 | A1 | 6/2014 | Chang et al. |
| 2014/0177352 | A1 | 6/2014 | Lum |
| 2014/0191339 | A1 | 7/2014 | Hong |
| 2014/0203236 | A1 | 7/2014 | Chen et al. |
| 2014/0233330 | A1 | 8/2014 | Ko et al. |
| 2014/0241077 | A1 | 8/2014 | Katoch et al. |
| 2014/0264222 | A1 | 9/2014 | Yang et al. |
| 2014/0264233 | A1 | 9/2014 | Tu et al. |
| 2014/0269114 | A1 | 9/2014 | Yang et al. |
| 2014/0282326 | A1 | 9/2014 | Chen et al. |
| 2017/0141037 | A1 | 5/2017 | Wu et al. |

\* cited by examiner

200

METHODS AND STRUCTURES OF NOVEL CONTACT FEATURE

PRIORITY DATA

The present application is a continuation application of U.S. application Ser. No. 15/670,052, filed Aug. 7, 2017, which is a divisional application of U.S. application Ser. No. 14/941,802, filed Nov. 16, 2015, each of which is hereby incorporated by reference in its entirety.

BACKGROUND

Integrated circuits include several types of components, particularly transistors. One type of transistor is a Metal Oxide Semiconductor Field Effect Transistor (MOSFET). MOSFET devices include a gate structure on top of a semiconductor substrate. Both sides of the gate structure are then doped to form source and drain regions. A channel is formed between the source and drain regions beneath the gate. Based on the voltage bias applied to the gate, electric current may either be allowed to flow through the channel or be inhibited from doing so.

In some cases, the channel may be formed using a fin structure. The fin structure extends out of the substrate and runs perpendicular to the gate structure formed on the substrate and fin structures. Doped regions, such as source and drain regions are formed in the fin structure on both sides of the gate structure. To connect the transistor to other components, a conductive contact connects to the source or drain regions. In some cases, a source or drain region is to be connected to an adjacent gate structure. However, due to the narrow width of the fin structure, it can be difficult to position a contact on a source or drain region such that there is good electrical contact between the contact and the source or drain region. Thus, it is desirable to improve the contact in such situations.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
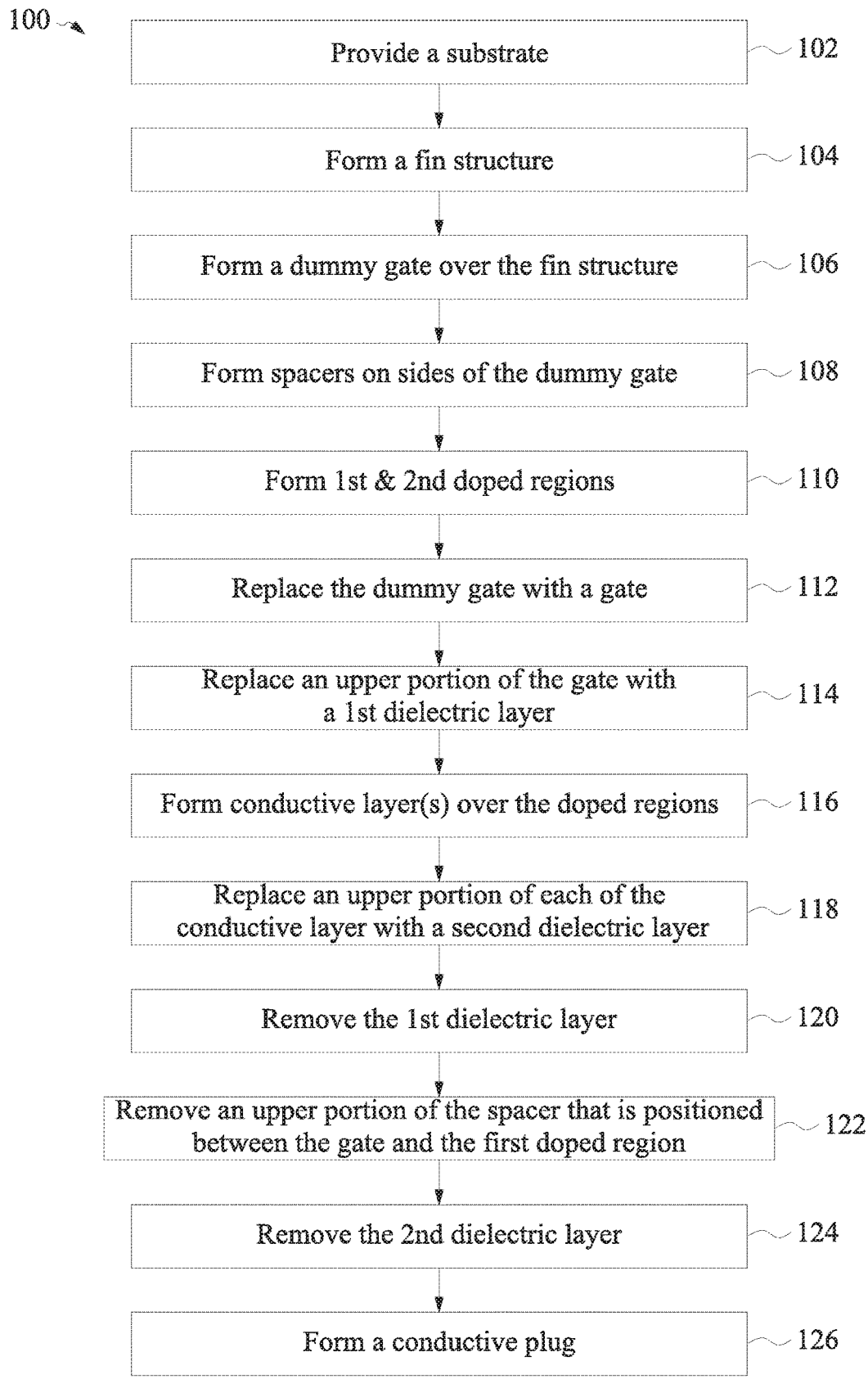
FIG. 1 depicts a method of fabricating a semiconductor device in accordance with various embodiments.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 is a flowchart of a method 100 of fabricating a semiconductor device 200 that includes a fin structure according to various aspects of the present disclosure in one or more embodiments. The method 100 is described with reference to FIG. 1 and in conjunction with FIGS. 2A, 2B, 2C, 2D, 2E, 2F, 2G, 2H, 2I, 2J, 2K, 2L, 2M, 2N, 2O, 2P, 2Q, 2R, 2S, 2T, and 2U. In some embodiments, the semiconductor device 200 fabricated according to the disclosed method 100 may be an element of a memory device (e.g., a static random access memory (SRAM) cell). For example, the fin structure of the semiconductor device 200 may serve as a gate feature/drain feature/source feature of a pull-up and/or a pull-down device in a SRAM cell. It is understood that additional steps can be provided before, during, and/or after the method 100, and some of the steps described can be replaced, eliminated, and/or moved around for additional embodiments of the method 100.

Figure 2A:
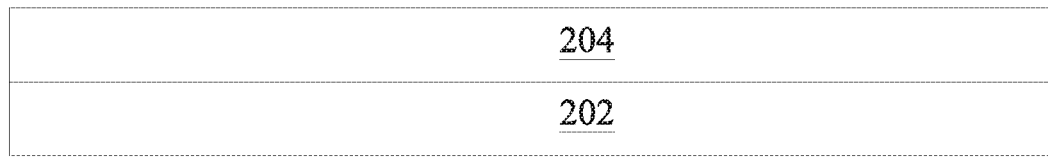
FIGS. 2A, 2B, 2C, 2D, 2E, 2F, 2G, 2H, 2I, 2J, 2K, 2L, 2M, 2N, 2O, 2P, 2Q, 2R, 2S, 2T, and 2U depict cross-sectional views of a semiconductor device fabricated by the method of FIG. 1 in accordance with various embodiments.

Referring to FIGS. 1 and 2A, method 100 begins at operation 102 with providing a substrate 202 having a doped region 204. In some embodiments, the doped region 204 may be an n-well and/or a p-well. In the following discussion, the doped region 204 may be illustrated as an n-well while the doped region 204 may include a p-well and still remain within the scope of the present disclosure. The substrate 202 is a semiconductor substrate, such as a semiconductor wafer. The substrate 202 may be made of a semiconductor material such as silicon. In some examples, other materials such as germanium and/or III-V compound semiconductor materials may be used for the substrate 202. In the illustrated embodiment of FIG. 2A, the n-well 204 is a portion of the semiconductor substrate 202 that is doped with n-type dopants such as phosphorous and arsenic. As an example, one or more p-type field effect transistor (pFET) is to be formed over n-well 204. In the alternative embodiments in which the doped region 204 includes a p-well, a p-well may be alternatively formed thereon, such as when one or more n-type field effect transistor (nFET) is to be formed over the p-well 204.

Figure 2B:
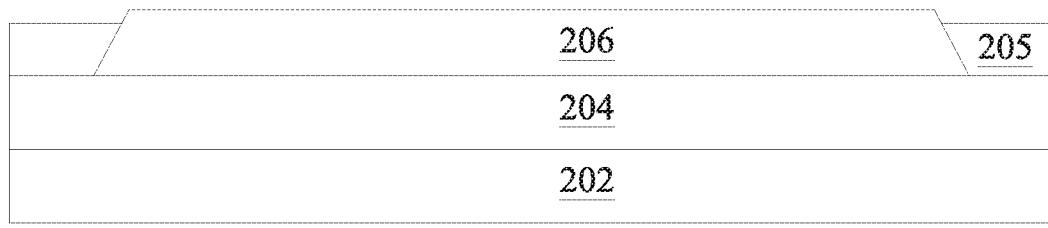

Referring to FIGS. 1 and 2B, method 100 proceeds to operation 104 with forming a fin structure 206 on the substrate 202. Generally, the fin structure 206 is a narrow fin that extends from the substrate 202/n-well 204. In that regard, as integrated circuit devices have continued to be scaled down the average feature sizes have become increasingly small. Here, fin structure 206 is a narrow fin having a width of about 5 nanometers to about 10 nanometers.

In some embodiments, the fin structure 206 is surrounded by an isolation structure, such as shallow trench isolation (STI) structure 205 as illustrated in FIG. 2B. The STI structure 205 includes one or more dielectric material feature that electrically isolates fin structure 206 from other fin structures and/or other components. In some embodiments, the STI structure is formed by a procedure that includes patterning the substrate to form trenches therein; filling the trenches with one or more dielectric material; and performing a polishing process (such as chemical mechanical polishing or CMP). The fin structure 206 may be formed in a variety of ways. In some embodiments, the fin structure 206 may be formed by a procedure having an epitaxial growth process. In furtherance of the embodiments, fin structure 206 are formed in the substrate; and a semiconductor material is epitaxially grown on the substrate, thereby forming fin-like active region 206. In some other embodiments, the fin structure 206 is formed by a procedure that includes etching the STI. First, STI structures 205 are formed in the substrate; and thereafter, an etching process is applied to selectively etch the STI, thereby fin-like active region is formed since the STI is recessed by the etching.

Figure 2C:
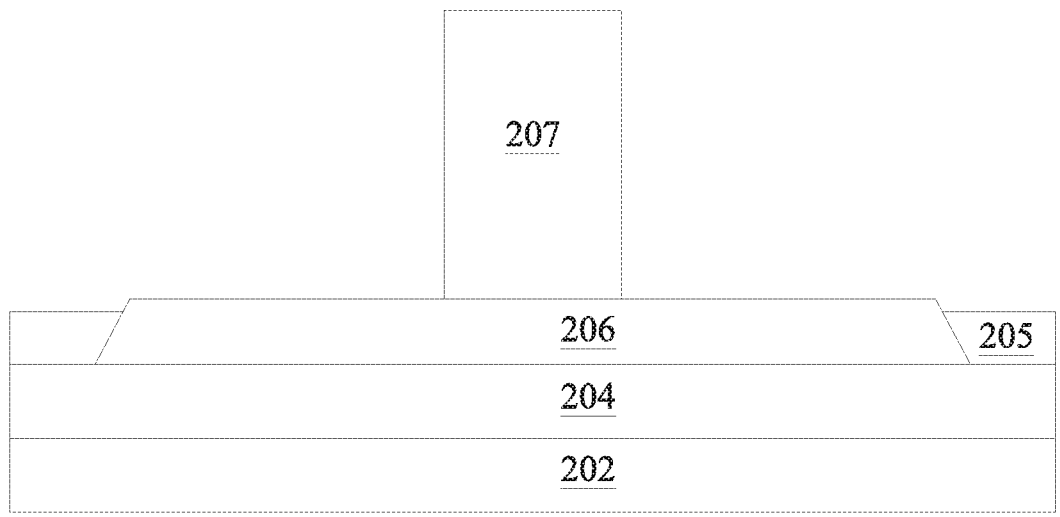

Referring to FIGS. 1 and 2C, method 100 proceeds to operation 106 with forming a dummy gate 207 on the fin structure 206. The dummy gate 207 may be made of a material such polysilicon. In some embodiments, while forming a metal gate structure, a dummy gate is typically formed where the metal gate structure is intended to be. The dummy gate is used because the metal material and/or high k dielectric material used in the metal gate can be damaged by various processes such as the annealing process used to form a later formed doped region. Thus, the dummy gates are formed first and then a doped region (which will be described and illustrated below) is formed. After the doped region is formed, the dummy gate can be replaced with a metal gate structure.

Figure 2D:
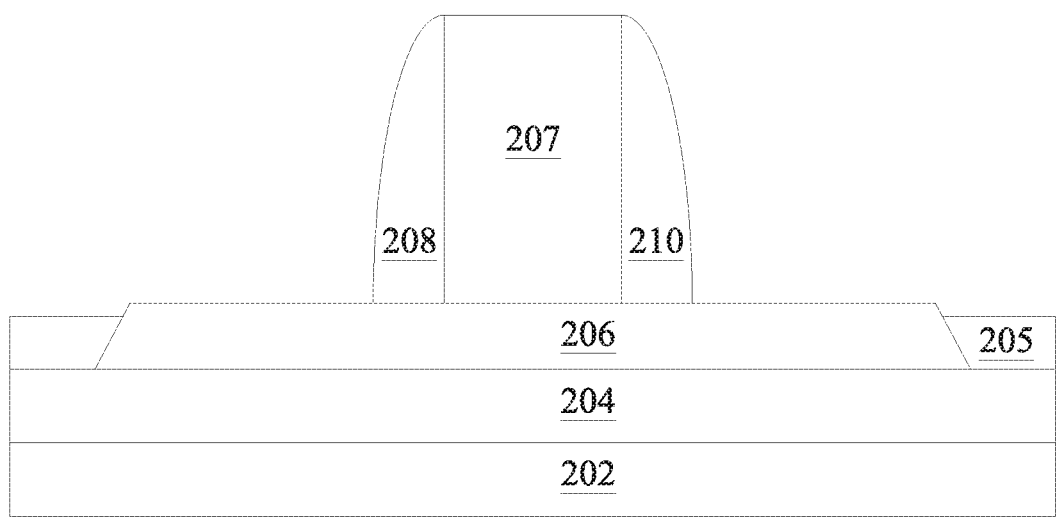

Referring now to FIGS. 1 and 2D, the method 100 proceeds to operation 108 with forming spacers 208 and 210 on both sides of the dummy gate 207. In the illustrated embodiments of FIG. 2D, each of the spacers 208 and 210 extends from the fin structure 206 along a sidewall of the dummy gate 207. The spacers 208 and 210 may be formed using a procedure that includes deposition and anisotropic etching. The spacers 208 and 210 include one or more dielectric material. In a specific embodiment of the present disclosure, the spacers 208 and 210 are formed of silicon oxycarbonitirde (SiOCN), aluminum oxide (AlO), and aluminum oxynitride (AlON). The spacers 208 and 210 are designed to stay in place even after the dummy gate 207 is removed, which will be discussed in more detail below.

Figure 2E:
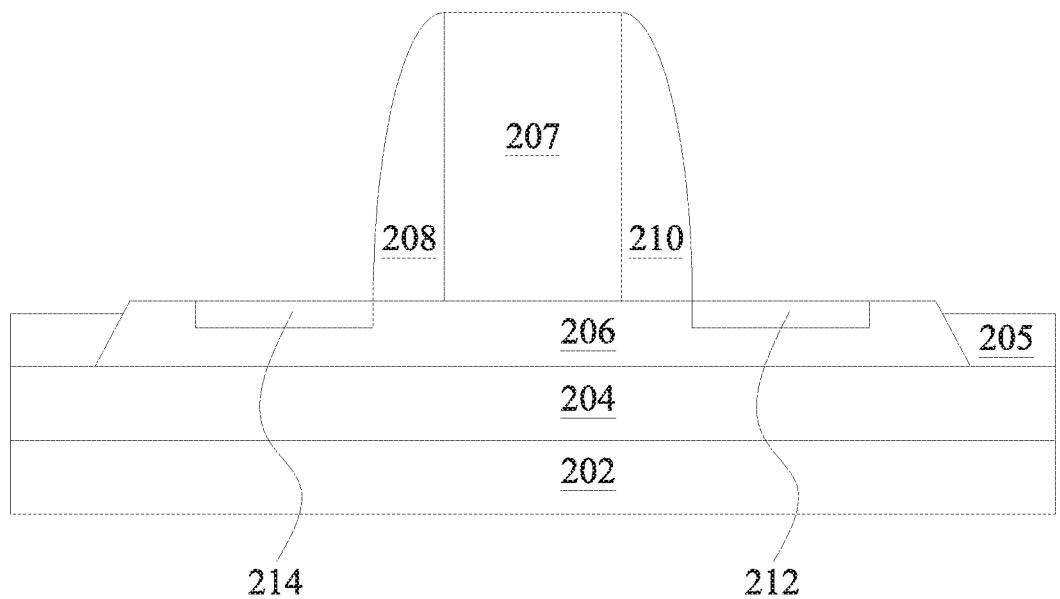

Referring to FIGS. 1 and 2E, the method 100 proceeds to operation 110 with forming one or more doped regions in the fin structure 260 and adjacent the spacers 208 and 210. In the illustrated embodiment of FIG. 2E, two doped regions 212 and 214 are formed respectively adjacent to one of the spacers. For example, the doped region 212 is formed adjacent to the spacer 210; and the doped region 214 is formed adjacent to the spacer 208. The doped region 208/210 is a doped feature of the fin structure 206. In the present embodiment, the doped region 212/214 acts as a source feature or a drain feature for a transistor device. The doped region may be formed by introducing a dopant to the fin structure by a suitable technique, such as ion implantation. In some examples, the doped region is formed by removing a portion of the fin structure and replacing that portion with a doped semiconductor material using an epitaxial process. An epitaxial process involves growing a semiconductor structure on a semiconductor substrate. During the epitaxial process, the regrown semiconductor material may be doped in-situ, for example, with a B11 species of dopant. Other species of dopants may be used as well. The regrown portion may be made of silicon (Si), germanium (Ge), silicon germanium (SiGe), silicon germanium carbon (SiGeC) or a III-V compound semiconductor material. The doped region may also be made of silicon phosphorous (SiP), silicon carbon (SiC), silicon phosphorous carbon (SiPC), or combination thereof. In the present embodiment, the doped region 212/214 is formed after the formation of the dummy gate 207 and the spacers 208/210.

Figure 2F:
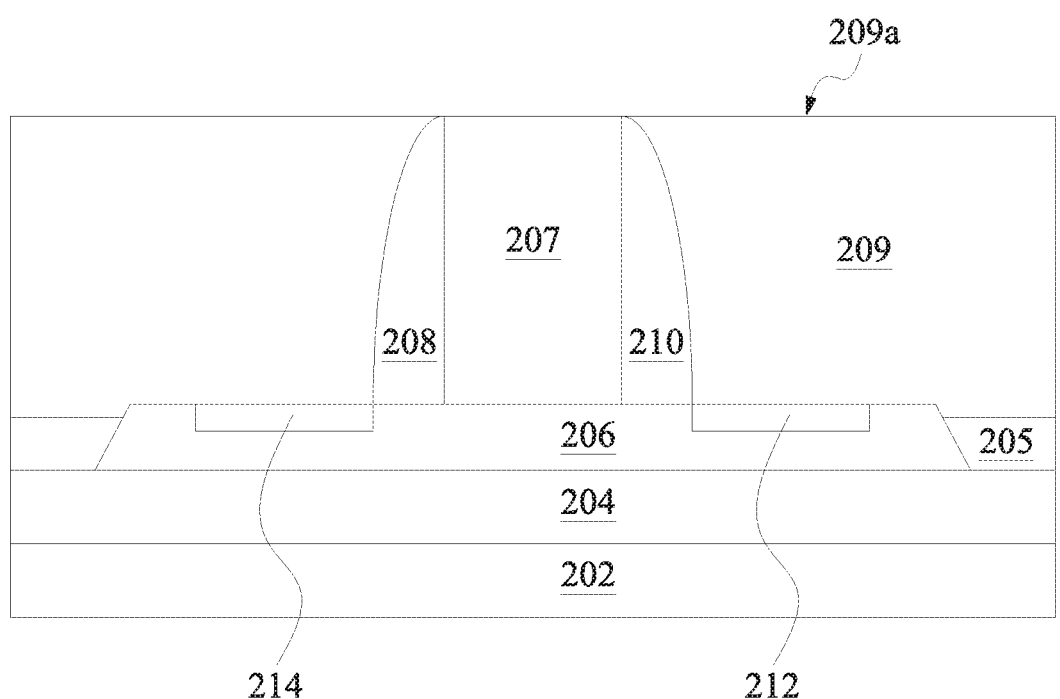

Referring now to FIG. 2F, during or after the operation 110 with forming the doped regions, an Interlayer Dielectric (ILD) layer 209 may be formed over the dummy gate 207. The ILD layer 209 is a dielectric material that is used to electrically isolate various components formed throughout the integrated circuit. In the illustrated embodiment of FIG. 2F, the ILD layer 209 may be deposited over the dummy gate 207 and be further planarized by a CMP process so as to have a coplanar surface 209a.

Figure 2G:
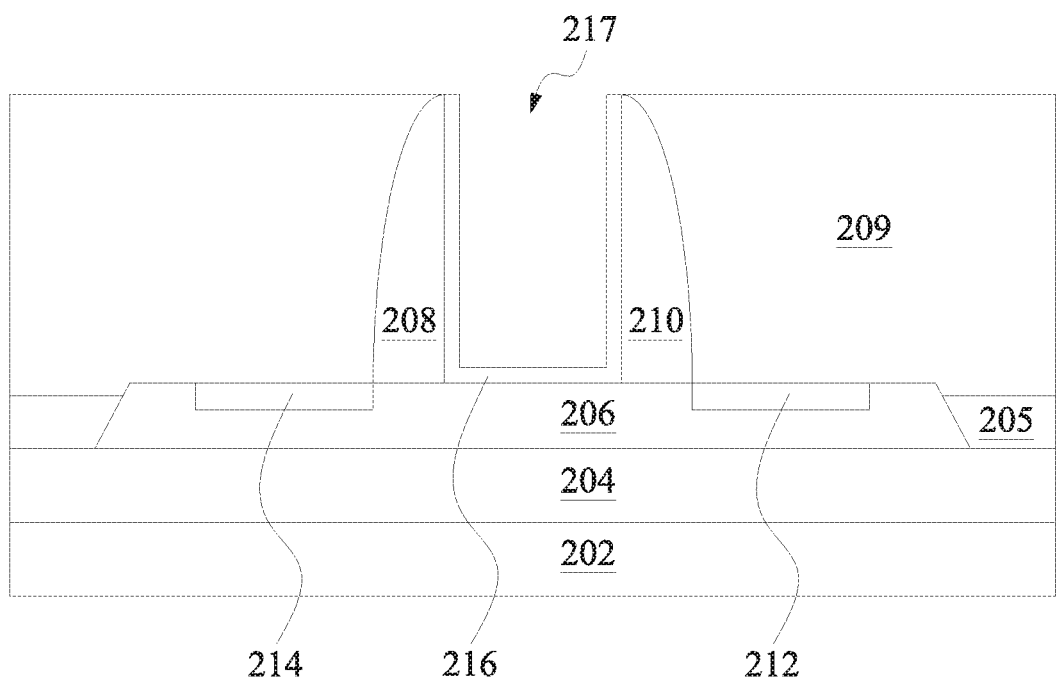
Figure 2H:
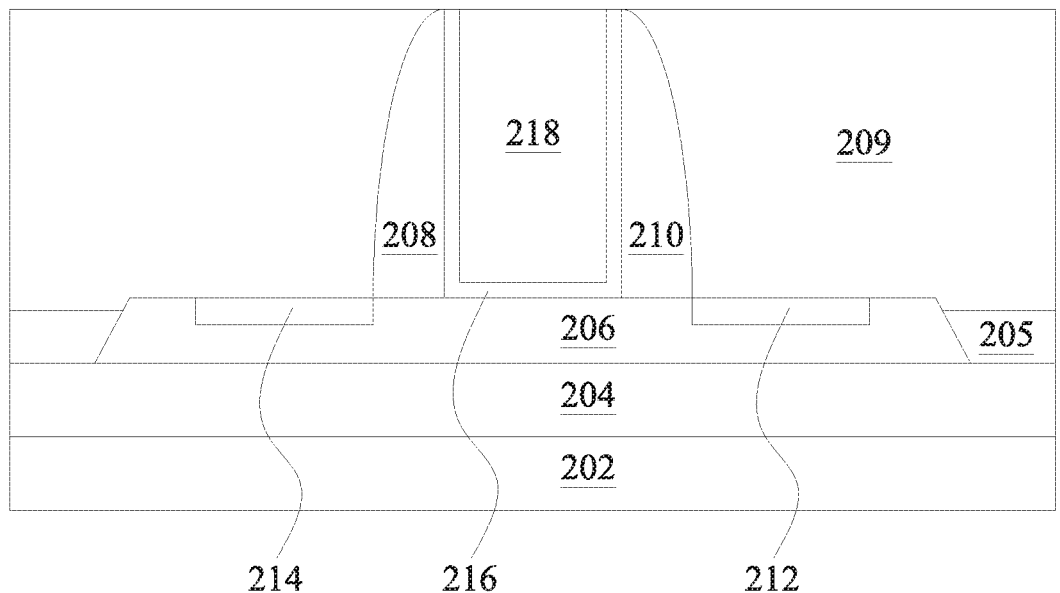

Referring to FIGS. 1, 2G, and 2H, the method 100 proceeds to operation 112 of removing the dummy gate 207 with a metal gate 218. In one example, a selective etching process is used to remove the material that forms the dummy gate 207 while leaving the ILD layer 209 and the spacers 208 and 210 substantially intact. After the dummy gate 207 has been removed, a trench 217 exists between the two spacers 208 and 210. The trench can then be filled with materials (e.g., conductive materials) that form the metal gate 218. According to the present example, a high-k dielectric layer 216 is formed within the trench 217. The high-k dielectric layer 216 is commonly used with a metal gate structure as a gate dielectric layer between the metal gate (e.g., metal gate 218) and a semiconductor material (e.g., the fin structure 206). In another example, the gate dielectric layer includes an interfacial layer (such as silicon oxide) and a high-k dielectric layer on the interfacial layer. After the high-k material 216 is in place, the metal gate 218 can then be formed. The metal gate 218 is formed by deposition of a metal material into the trench left by removal of the dummy gates 207. A CMP process may then be used to smooth the surface of the ILD layer 209 and any excess metal material on top of the metal (replacement) gate 218. The metal material used to form the metal gate 218 may be selected from a variety of appropriate metals such as aluminum, tungsten, copper, silicide, or combination thereof. In some embodiments, the metal gate 218 includes a first metal layer with a suitable work function (referred to as work function metal) and another metal layer (such as aluminum) on the work function metal. The work function metal has a proper work function (such as greater than about 5.2 eV for a pFET) to reduce the threshold voltage of the filed effect transistor and enhance the device performance. In one example, the work function metal for the pFET includes titanium nitride.

Figure 2I:
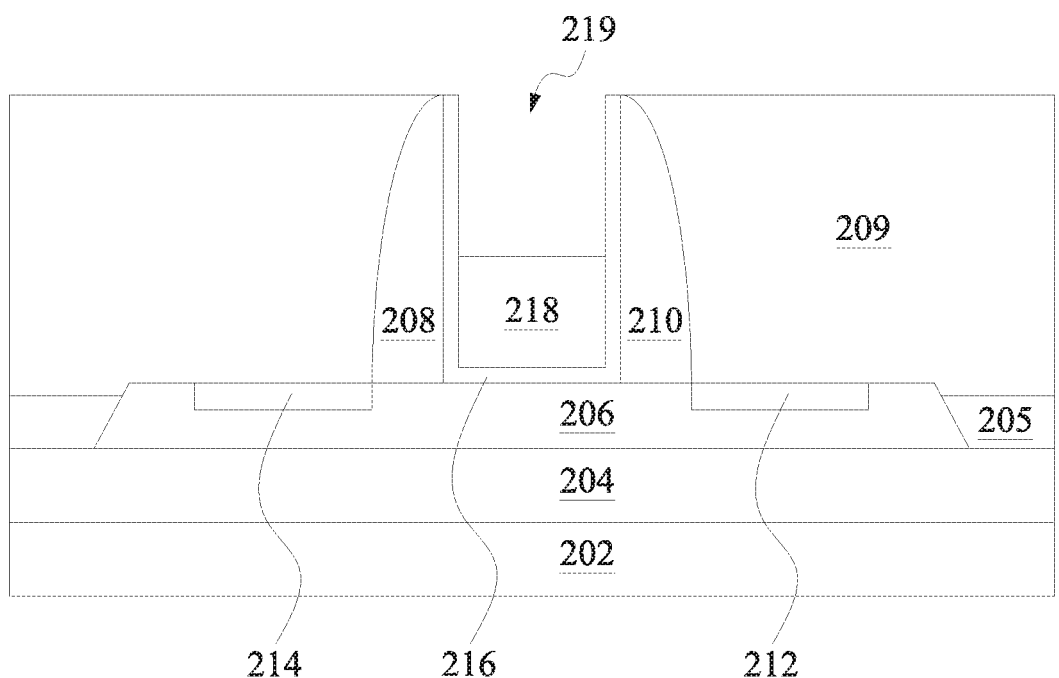
Figure 2J:
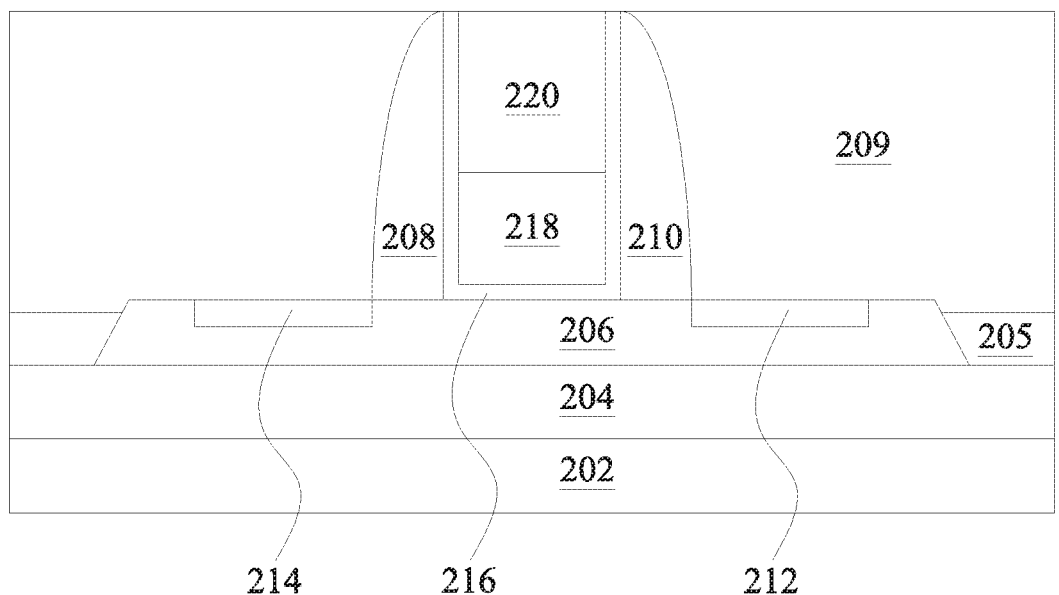

Referring to FIGS. 1, 2I, and 2J, the method 100 proceeds to operation 114 with replacing an upper portion of the metal gate 218 with a dielectric layer 220. The operation 114 may include multiple processes such as, for example, selectively recessing (e.g., dry or wet etching) the upper portion of the metal gate 218 thereby forming a trench 219 (surrounded by the metal gate 218, and the spacers/high-k dielectric layer), depositing a dielectric material to fill the trench 219, and performing a planarization process to remove any excess dielectric material. In some embodiments, the deposition of the dielectric material to form the dielectric layer 220 may include using chemical vapor deposition (CVD), a spin-on coating, atomic layer deposition (ALD), and/or other deposition technology. Further, in a specific embodiment of the present disclosure, the material used to form the dielectric layer 220 may include silicon nitride (SiN) while other dielectric materials may be used and remain within the scope of the present disclosure as long as the dielectric layer 220 has an etch selectivity different than an etch selectivity of the spacers 208/210.

Figure 2K:
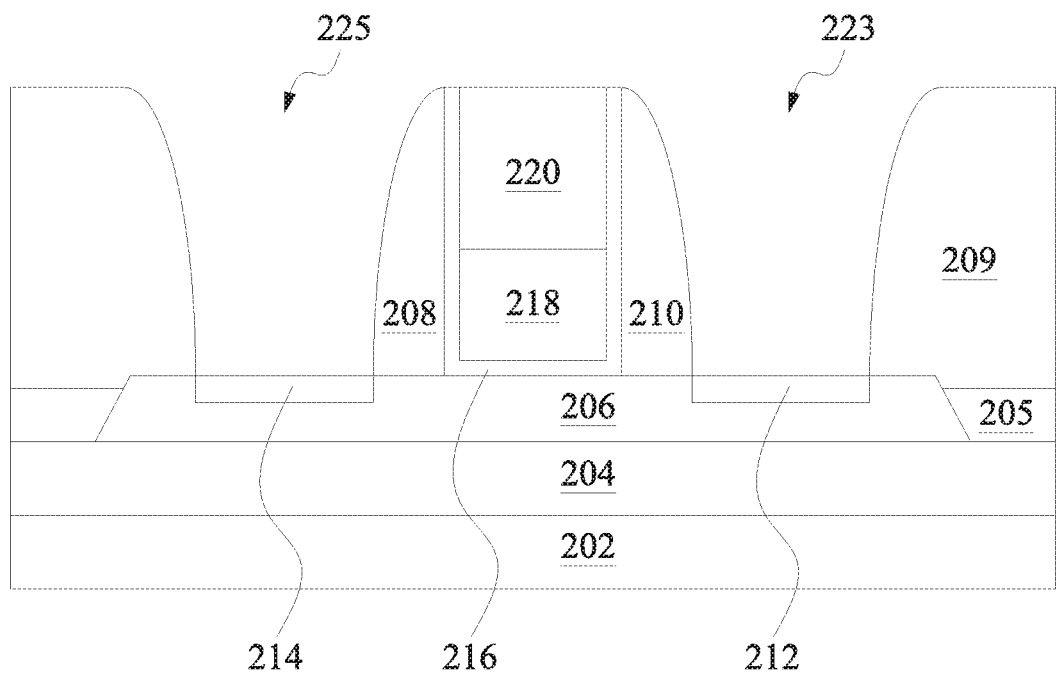
Figure 2L:
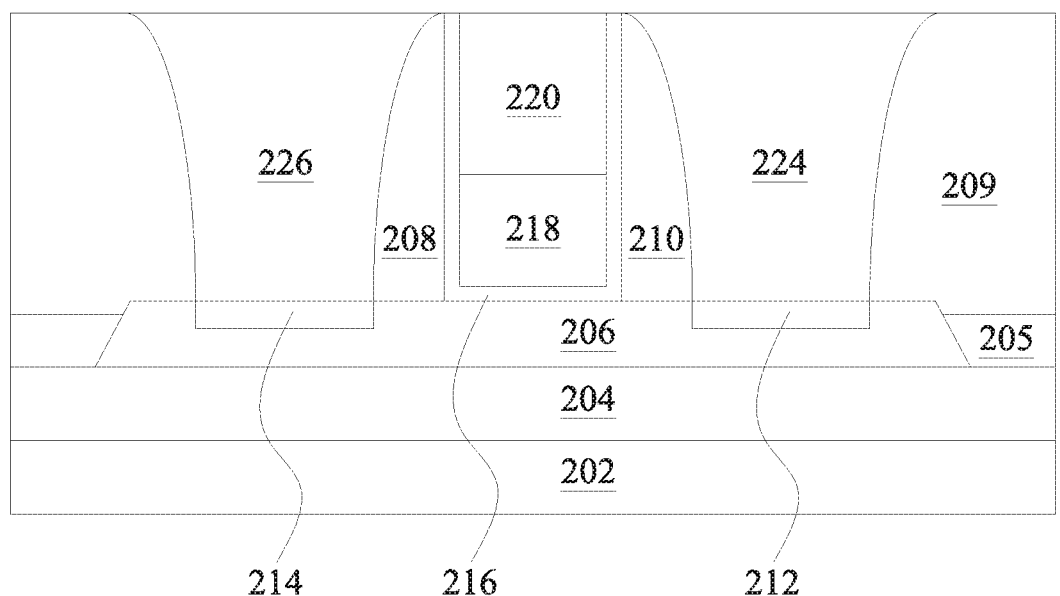

Referring to FIGS. 1, 2K and 2L, the method 100 proceeds to operation 116 with forming a conductive layer over the doped region. In the illustrated embodiment of FIG. 2L, a conductive layer 224 in the ILD layer 209 is formed over the doped region 212; and a conductive layer 226 in the ILD layer 209 is formed over the doped region 214. Such a formation of the conductive layer 224/226 may include: forming a trench 223/225 (as illustrated in FIG. 2K) in the ILD layer 209 via an etching process; depositing a conductive material into the trench to form the conductive layer 224/226; performing a planarization process (e.g., CMP) to remove excessive conductive materials. Any of a variety of conductive materials may be used to form the conductive layer 224/226 such as, for example, aluminum, tungsten, copper, silicide, or combination thereof.

Figure 2M:
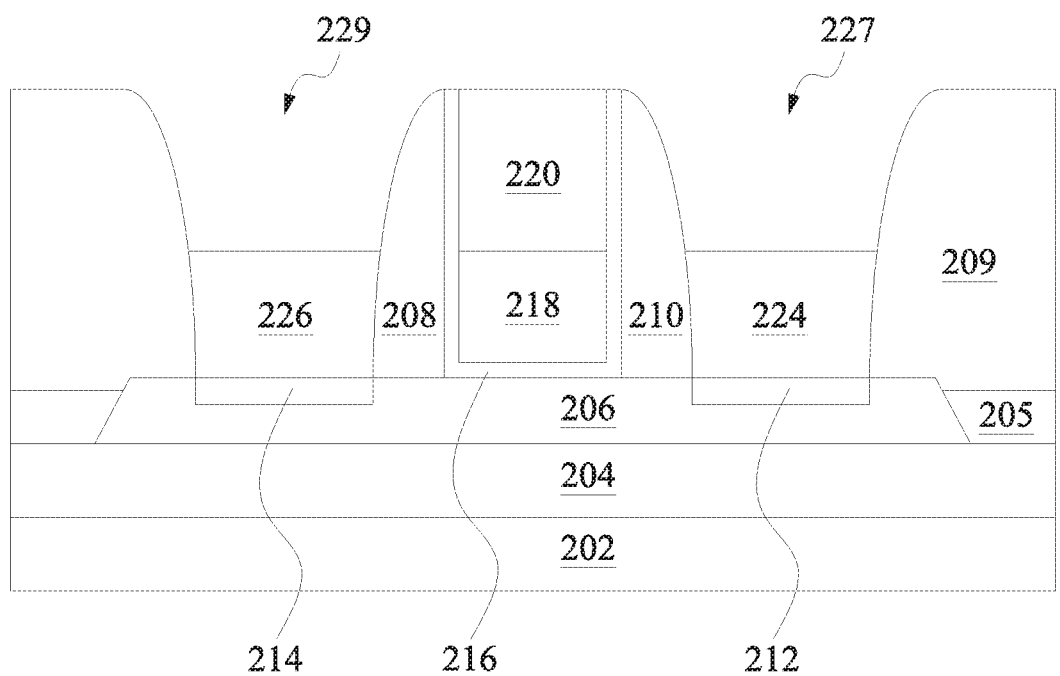
Figure 2N:
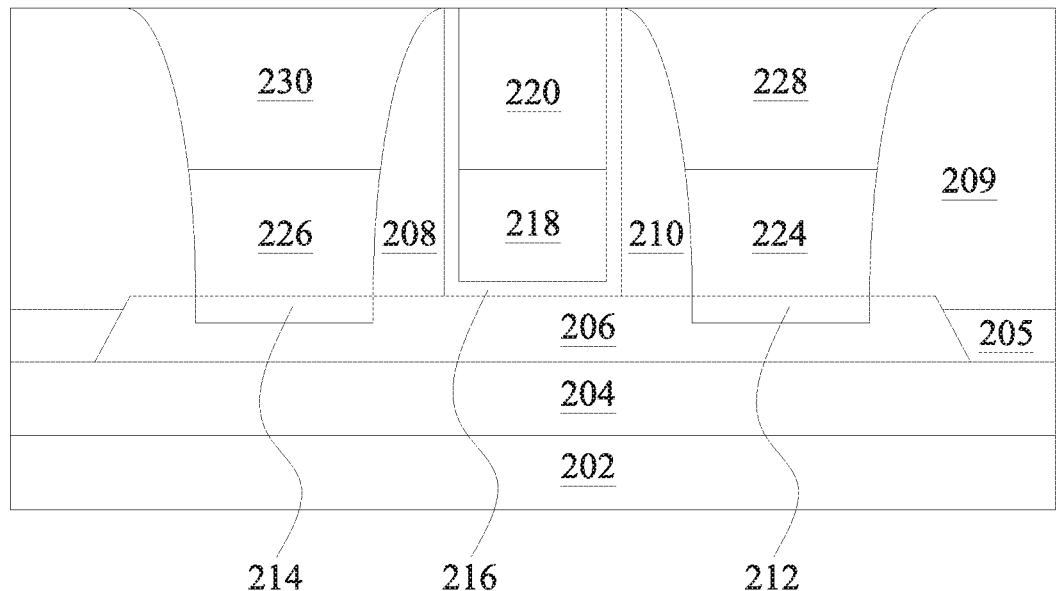

Referring to FIGS. 1, 2M, and 2N, the method 100 proceeds to operation 118 with replacing an upper portion of the conductive layer 224/226 with a dielectric layer 228/230. The operation 118 may include multiple processes such as, for example, selectively recessing (e.g., dry or wet etching) the upper portion of the conductive layer 224/226 thereby forming a trench 227/229 as shown in FIG. 2M (surrounded by the conductive layer 224/226, the spacer 208/210, and the ILD layer 209), depositing a dielectric material to fill the trench, and performing a planarization process to remove any excess dielectric material. In some embodiments, the deposition of the dielectric material to form the dielectric layer 228/230 may include using chemical vapor deposition (CVD), a spin-on coating, atomic layer deposition (ALD), and/or other deposition technology. Further, in a specific embodiment of the present disclosure, the material used to form the dielectric layer 228/230 may include silicon oxycarbide (SiOC) while other dielectric materials may be used and remain within the scope of the present disclosure as long as the dielectric layer 228/230 has an etch selectivity different than an etch selectivity of the spacers 208/210 and an etch selectivity of the dielectric layer 220.

Figure 2O:
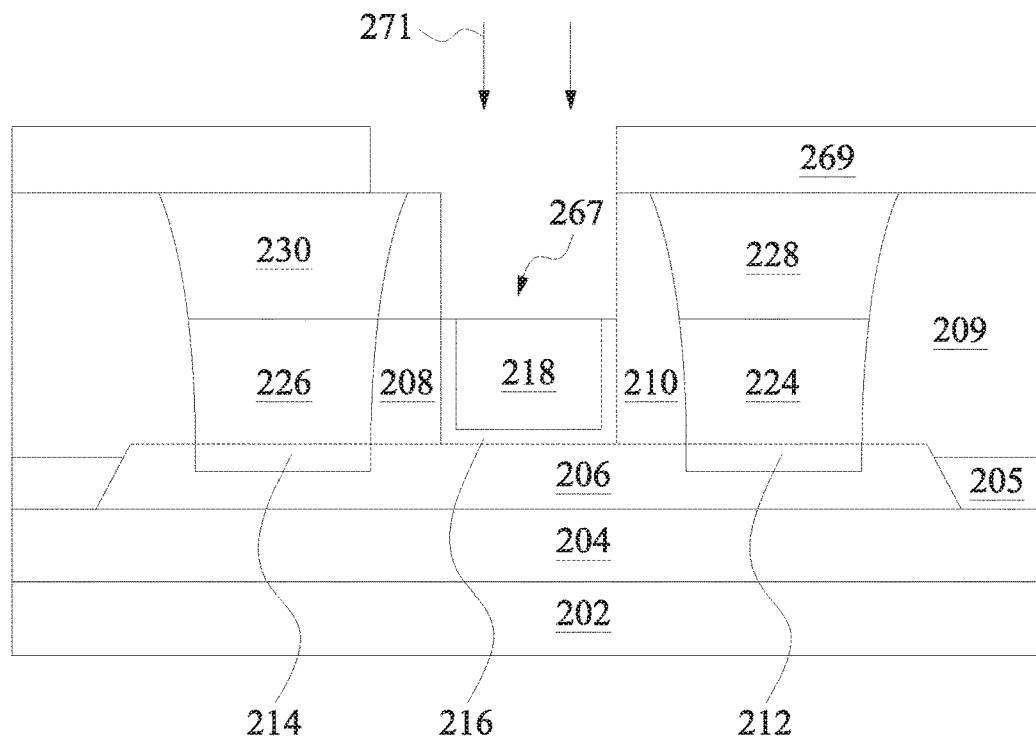

Referring to FIGS. 1 and 2O, the method 100 proceeds to operation 120 with removing the dielectric layer 220 to form a trench 267. In the illustrated embodiment of FIG. 2O, the removing the dielectric layer 220 may include removing an upper portion of the high-k dielectric layer 216 that surrounded the dielectric layer 220. In some embodiments, the removal of the dielectric layer 220 may include multiple processes: depositing a patterned mask layer (e.g., 269) over the substrate and a selective etching process 271 (e.g., a dry etching and/or a wet etching) using the patterned mask layer 269. Further, during/after the dielectric layer 220 (and the upper portion of the high-k dielectric layer 216) is removed via the selective etching process, the spacer 208/210 and the dielectric layer 228/230 remain intact because, as described above, the dielectric layer 220 has an etch selectivity that is different from the spacer 208/210 and the dielectric layer 228/230. Moreover, as shown, trench 267 exposes a portion of dielectric layer 228/230, spacers 208/210, HK 216 and metal gate 218.

Figure 2P:
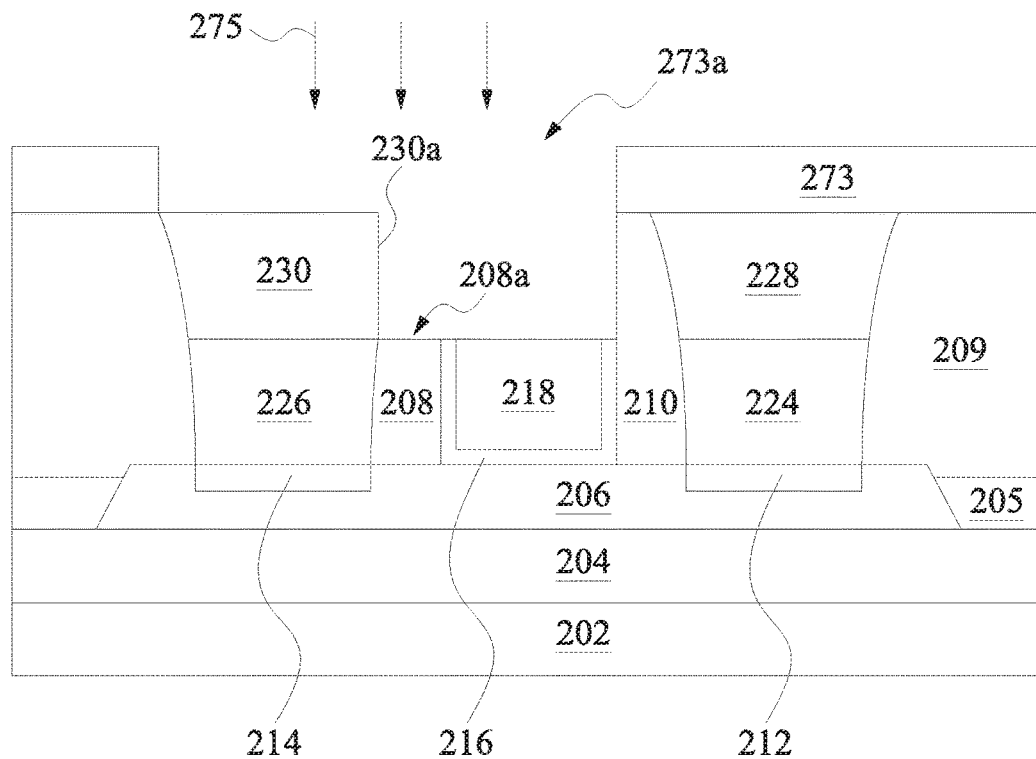

Referring to FIGS. 1 and 2P, the method 100 proceeds to operation 122 with removing an upper portion of the spacer 208 while leaving the spacer 210 intact. In some embodiments, the removal of the upper portion of the spacer 208 may include multiple processes: removing the patterned mask later 269, depositing another patterned mask layer 273 over the substrate (wherein the patterned mask layer 273 may include an opening 273a that is directed to the spacer 208 instead of the spacer 210), and a selective etching process 275 (e.g., a dry etching and/or a wet etching) to remove the upper portion of the spacer 208. In the illustrated embodiment of FIG. 2P, such a selective etching process may remove the upper portion of the spacer 208 so as to have a coplanar surface 208a (that includes gate 218 and the remaining portion of the spacer 208) and to expose a sidewall of the dielectric layer 230 (i.e., 230a as illustrated in FIG. 2P). Further, during/after the upper portion of the spacer 208 is removed via the selective etching process 275, the dielectric layer 230 remain intact because, as described above, the spacer 208 has an etch selectivity that is different from the dielectric layer 230.

Figure 2Q:
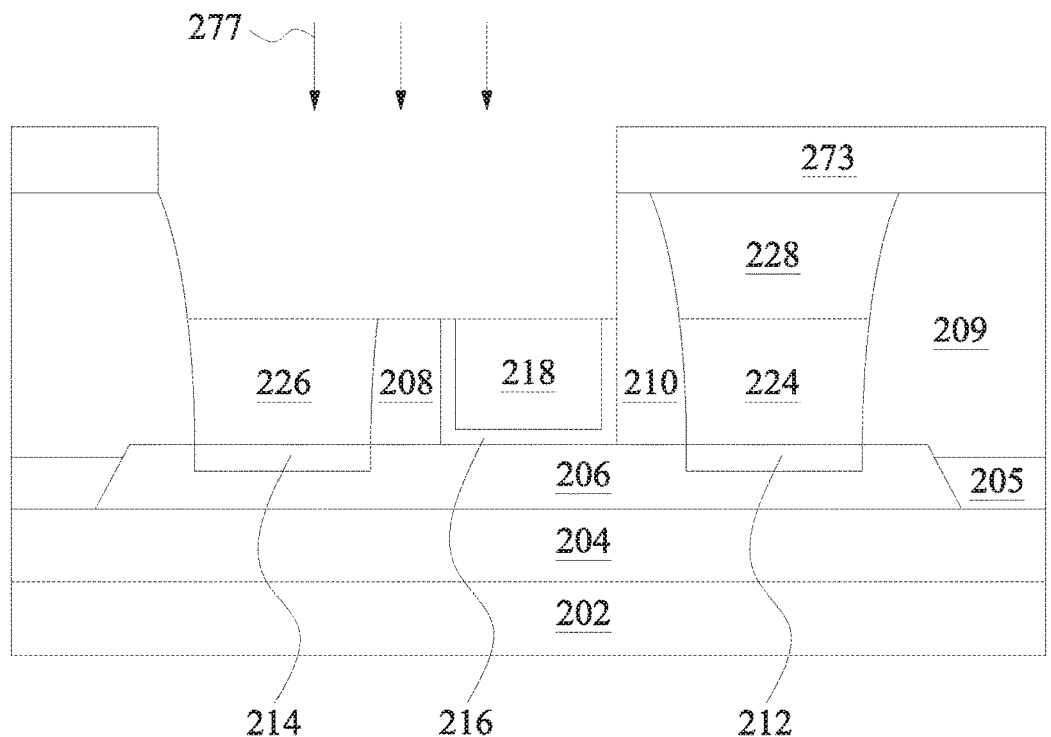
Figure 2R:
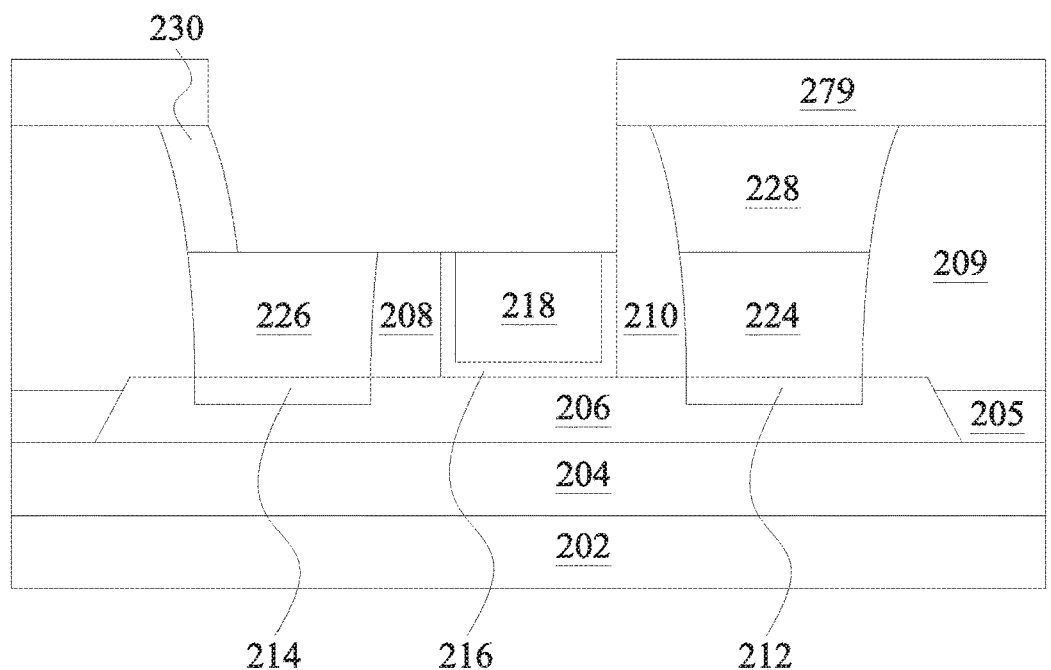

Referring to FIGS. 1 and 2Q, the method 100 proceeds to operation 124 with removing the dielectric layer 230 using the same patterned mask layer 273. Based on the fact that the dielectric layer 230 and the spacer 208 each has an etch selectivity that is different from the other, the removal of the dielectric layer 230 may include using another selective etching process 277. In an example, the etching process 275 and the etching process 277 may be respectively a dry etching process but with different etching condition. In the illustrated embodiment of FIG. 2Q, after the removal of the dielectric layer 230, a top surface of the conductive layer 226 is exposed. In some other embodiments, as illustrated in FIG. 2R, the removal of the dielectric layer 230 may include removing a portion of the dielectric layer 230 if another patterned mask layer 279 is used. As such, a remaining portion of the dielectric layer 230 may exist but with a portion of the top surface of the conductive layer 226 being exposed.

Figure 2S:
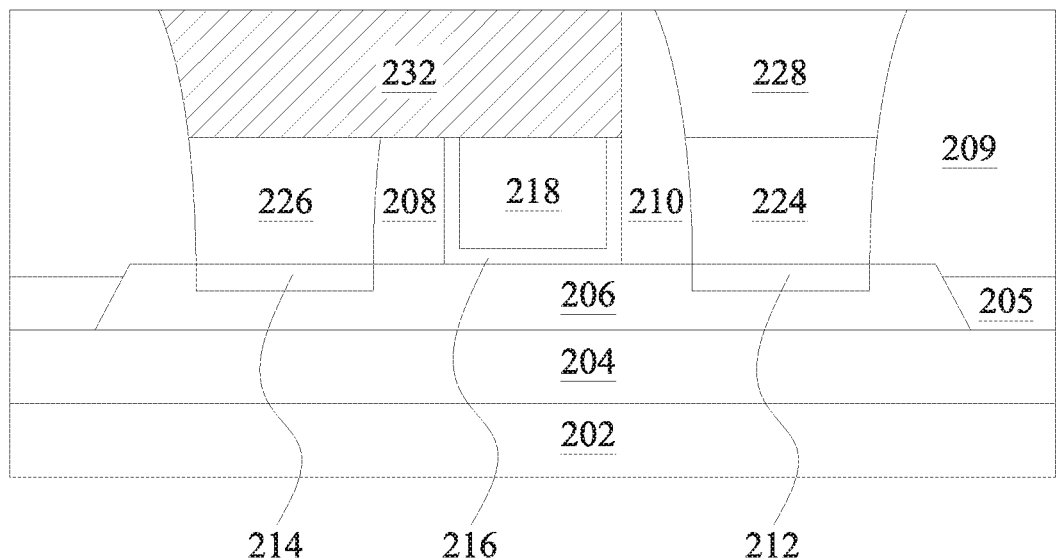
Figure 2T:
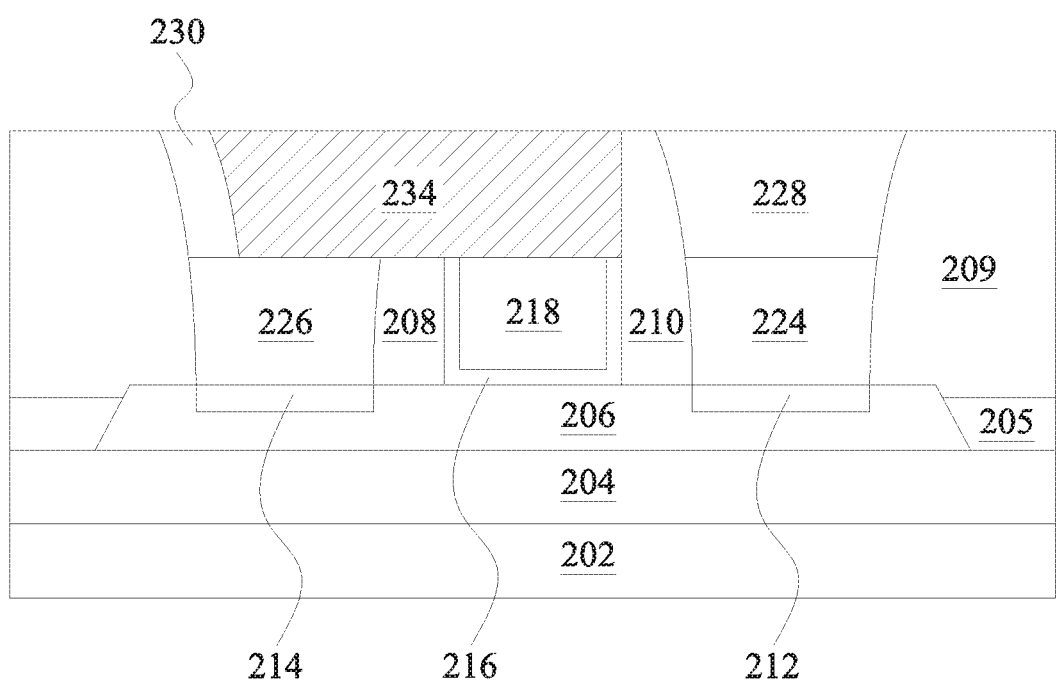

Referring to FIGS. 1 and 2S, the method 100 proceeds to operation 126 with forming a conductive feature 232 that electrically couples the gate 218 to the doped region 214. In some embodiments, the conductive feature may include a metal line, a via feature and/or a contact feature. In some embodiments, the formation of the conductive feature 232 may include depositing a conductive material layer over the exposed conductive layer 226 and the exposed gate 218. The conductive material may include aluminum, copper, titanium, polysilicon, metal silicide, metal alloy, or combinations thereof. In the embodiment in which a portion of the dielectric layer 230 exists after the process 277 (as shown in FIG. 2R), a conductive feature 234 may be formed as illustrated in the embodiments of FIG. 2T. Such a conductive feature 234 may be formed of a similar material as the conductive feature 232 such as, for example, aluminum, copper, titanium, polysilicon, metal silicide, metal alloy, or combinations thereof.

Figure 2U:
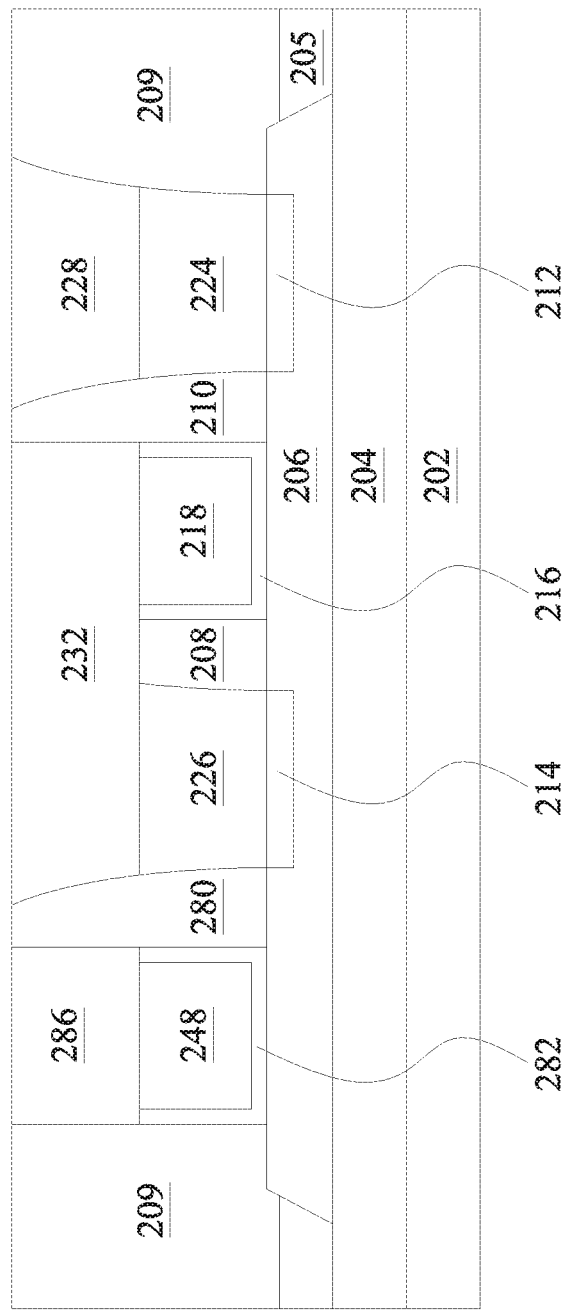

FIG. 2U illustrates an additional or alternative embodiment that the semiconductor device 200 further includes a second gate 284. In the illustrated embodiment, the gate 284 includes a high-k gate dielectric layer 282 that is similar to the gate 218. More specifically, the gate 284 is overlaid by a dielectric layer 286 and is spaced from the conductive feature 232 and the conductive layer 226 with a spacer 280. In some embodiments, the dielectric layer 286 is formed of a material that is similar to the dielectric layer 220 (as shown in FIGS. 2J-2N); and the spacer 280 is formed of a material that is similar to the spacer 208/210.

In some specific embodiments, such a contact feature to electrically couple a drain/source feature to a gate feature (e.g., 232 in FIG. 2S, 234 in FIG. 2T) may be referred to as a "butt contact" in a memory device (e.g., SRAM). As described above, it is desirable to improve the electrical contact between a doped region (i.e., source or drain region) of a fin-like active region (or a fin structure) with an adjacent gate structure. According to one embodiment of principles described herein, a portion of the spacer on one of the sides of a metal gate is removed to allow more room for the butt contact. The butt contact is formed by etching a trench to expose at least a portion of the conductive feature that is electrically coupled to the doped region and the top of the metal gate. The formation of the trench (i.e., the to-be butt contact) includes multiple selective etch processes such as, for example, etching of the dielectric layer 220, etching of part of the spacer 208, and etching of the dielectric layer 230, where each selective etching process provides an exclusive etching selectivity to a specific dielectric layer (e.g., 208, 220, and 230) due to the fact that each of the dielectric layers has been designed to have a distinct etch selectivity. The trench is then filled with a conductive material. Because the top portion of the spacer on one side of the metal gate (the side where a butt contact is to be formed) is removed, the conductive material makes direct contact with the top of the metal gate and the top of the conductive material for the doped region (e.g., the contact for the source/drain feature) while keeping an isolation feature between the metal gate and the doped region on the other side (e.g., 212/224 in FIG. 2S). It is understood that while the present example illustrates a metal gate, other examples embodying principles described herein may use other types of gates. Additionally, with the spacer removed, there is a larger exposed portion of the doped region for contact with the conductive material.

Various embodiments of a method of fabricating a semiconductor device are disclosed. In an embodiment, the method includes forming a fin structure on a substrate; forming a dummy gate over the fin structure; forming spacers on sides of the dummy gate; forming a doped region within the fin structure; replacing the dummy gate with a metal gate; replacing an upper portion of the metal gate with a first dielectric layer; forming a conductive layer directly on the doped region; replacing an upper portion of the conductive layer with a second dielectric layer; removing the first dielectric layer thereby exposing a sidewall of the spacer; removing an upper portion of the spacer to thereby expose a sidewall of the second dielectric layer; removing at least a portion of the second dielectric layer to form a trench; and forming a conductive plug in the trench.

In another embodiment, the method includes forming a fin structure on a substrate; forming a dummy gate over the fin structure; forming a first spacer on a first side of the dummy gate and a second spacer on a second side of the dummy gate; forming a doped region within the fin structure; forming an interlayer dielectric layer over the fin structure; removing the dummy gate to form a first trench between the first and second spacers; forming a gate dielectric layer within the first trench; forming a gate electrode over the gate dielectric layer within the first trench; removing a portion of the gate electrode to from a second trench between the first and second spacers; forming a first dielectric layer within the second trench; forming a conductive layer directly on the doped region; removing a portion of the conductive layer to form a third trench within the interlayer dielectric layer; forming a second dielectric layer within the third trench; removing at least a portion of the first dielectric layer to form a fourth trench that exposes the first spacer; removing a portion of the exposed first spacer to form a fifth trench that exposes the second dielectric layer; removing at least a portion of the exposed second dielectric layer to form a sixth trench; and forming a second conductive layer in the sixth trench.

Yet in another embodiment, a semiconductor device is disclosed. The semiconductor device includes a fin structure on a substrate; a first source/drain feature disposed on the fin structure; a first conductive layer disposed directly on the first source/drain region; a first gate disposed over the fin structure; a first spacer that includes a first portion disposed along a first side of the first gate and a second portion disposed along a second side of the first gate, wherein the first portion of the first spacer has a top surface that is substantially coplanar with a top surface of the first gate and the second portion of the first spacer has a sidewall facing the first portion of the first spacer; and a second conductive layer disposed over the first conductive layer and physically contacting the top surface of the first portion of the spacer, the top surface of the first gate, and the sidewall of the second portion of the first spacer.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a fin structure on a substrate;
    a first gate disposed over the fin structure, the first gate including a gate dielectric layer;
    a first spacer disposed along a first side of the first gate and a second spacer disposed along a second side of the first gate, the second side being opposite the first side, wherein the first spacer, the second spacer and the first gate each have a top surface that faces away from the substrate, wherein the second spacer has a first sidewall facing the first spacer and an opposing second sidewall facing away from the first spacer, the gate dielectric layer physically contacting the first sidewall of the second spacer; and
    a first conductive layer disposed over and physically contacting the top surface of the first spacer, the top surface of the first gate, the gate dielectric layer and the first sidewall of the second spacer, wherein the first conductive layer has a top surface facing away from the substrate such that the respective top surfaces of the first conductive layer and the second spacer extend to the same height over the substrate.

2. The device of claim 1, wherein the first gate further includes a gate electrode, and
    wherein the first conductive layer physically contacts the gate electrode.

3. The device of claim 2, wherein the gate dielectric layer is formed of a high-k dielectric material and the gate electrode is formed of a metal material.

4. The device of claim 1, wherein the first spacer extends to a first height over the substrate and the second spacer extends to a second height over the substrate that is greater than the first height.

5. The device of claim 1, further comprising a second conductive feature disposed on a first source/drain feature between the first conductive feature and the first source/drain feature.

6. The device of claim 5, wherein the first spacer and the second conductive feature extend to the same height over the substrate.

7. The device of claim 6, wherein the second conductive feature has a top surface facing away from the substrate, and wherein the first conductive feature covers a first portion of the top surface of the second conductive feature while a second portion of the top surface of the second conductive feature is not covered by the first conductive feature.

8. The device of claim 7, further comprising a dielectric material layer physically contacting the second portion of the top surface of the second conductive feature.

9. A device comprising:
a first gate structure disposed over a substrate, the first gate structure including a first gate dielectric and a first gate electrode, the first gate electrode and the first gate dielectric each having a top surface facing away from the substrate;
a first sidewall spacer disposed along a first side of the first gate structure and a second sidewall spacer disposed along a second side of the first gate structure, the second side of the first gate structure being opposite the first side of the first gate structure, the first sidewall spacer having a top surface facing away from the substrate;
a first source/drain feature associated with the first gate structure; and
a first conductive feature extending from the first gate structure to over the first source/drain feature, the first conductive feature physically contacting the respective top surfaces of the first gate dielectric, the first gate electrode and the first sidewall spacer and physically contacting the second sidewall spacer, wherein the respective top surfaces of the first gate dielectric, the first gate electrode, and the first sidewall spacer extend to the same height over the substrate.

10. The device of claim 9, further comprising a second conductive feature disposed on the first source/drain feature, and wherein the first conductive feature physically contacts the second conductive feature.

11. The device of claim 9, wherein the second sidewall spacer extends to a greater height over the substrate than the first sidewall spacer.

12. The device of claim 10, wherein the second sidewall spacer has a first side surface facing the first sidewall spacer and an opposing second side surface facing away from the first sidewall spacer.

13. The device of claim 12, wherein the first conductive feature physically contacts the first side surface of the second sidewall spacer.

14. The device of claim 12, further comprising:
a second source/drain feature associated with the first gate structure;
a third conductive feature disposed on the second source/drain feature and physically contacting the second sidewall spacer.

15. The device of claim 9, further comprising a second conductive feature disposed on the first source/drain feature, and
wherein the first sidewall spacer includes:
a first side surface facing the first gate structure, wherein the first gate dielectric physically contacts the entire first side surface;
a second side surface facing the second conductive feature, wherein the second conductive feature physically contacts the entire second side surface; and
the top surface extending from the first side surface to the second side surface, wherein the first conductive feature physically contacts the entire top surface of the first sidewall spacer.

16. A device comprising:
a fin structure disposed on a substrate;
a gate structure disposed over the fin structure, the gate structure including a gate dielectric and a gate electrode;
a first sidewall spacer disposed along a first side of the gate structure and a second sidewall spacer disposed along a second side of the gate structure, the second side of the gate structure being opposite the first side of the gate structure, the first sidewall spacer and the second sidewall spacer each having a top surface facing away from the substrate, the top surface of the first sidewall spacer being at a first level and the top surface of the second sidewall spacer being at a second level that is different than the first level;
a first source/drain feature disposed in the fin structure;
a first conductive feature interfacing with the first sidewall spacer and disposed on the first source/drain feature, the first conductive feature having a top surface facing away from the substrate;
a second conductive feature disposed over the first conductive feature and physically contacting the top surface of the first conductive feature, wherein the second conductive feature physically contacts the first and second sidewall spacers; and
a first dielectric material layer disposed over the first conductive feature and physically contacting the top surface of the first conductive feature.

17. The device of claim 16, wherein the second conductive feature further physically contacts the gate dielectric and the gate electrode.

18. The device of claim 16, wherein the second conductive feature physically contacts a side surface of the second sidewall spacer without physically contacting the top surface of the second sidewall spacer, and
wherein the second conductive feature physically contacts top surface of the first sidewall spacer without physically contacting a side surface of the first sidewall spacer.

19. The device of claim 16, further comprising:
a second gate structure disposed over the fin structure;
a third sidewall spacer disposed along a sidewall of the second gate structure, and
wherein the second conductive feature extends continuously from the second sidewall spacer the to the third sidewall spacer.

20. The device of claim 16, wherein the first and second sidewall spacers are formed of a material selected from the group consisting of silicon oxycarbonitirde (SiOCN), aluminum oxide (AlO), and aluminum oxynitride (AlON).

* * * * *